United States Patent [19]

Chiang et al.

[11] 4,133,698

[45] Jan. 9, 1979

[54] TANDEM JUNCTION SOLAR CELL

[75] Inventors: Shang-Yi Chiang; Bernard G. Carbajal, both of Richardson, Tex.

[73] Assignee: Texas Instruments Incorporated, Dallas, Tex.

[21] Appl. No.: 864,283

[22] Filed: Dec. 27, 1977

[51] Int. Cl.² .................................... H01L 31/06
[52] U.S. Cl. .................... 136/89 SJ; 136/89 CC; 136/89 TF; 357/20; 357/30; 357/68
[58] Field of Search .......... 136/89 SJ, 89 CC, 89 TF; 357/30, 20, 68

[56] References Cited

U.S. PATENT DOCUMENTS 4,070,206  1/1978  Kressel et al. ............... 136/89 TF
4,072,541  2/1978  Meulenberg et al. ......... 136/89 SJ

OTHER PUBLICATIONS

M. D. Lammert et al., "The Interdigitated Back Contact Solar Cell: A Silicon Solar Cell for Use in Concentrated Sunlight", *IEEE Trans. Electron Devices*, vol. ED-24, pp. 337-341 (1977).

*Primary Examiner*—John H. Mack
*Assistant Examiner*—Aaron Weisstuch
*Attorney, Agent, or Firm*—James T. Comfort; Gary C. Honeycutt

[57] ABSTRACT

A solar cell having first and second closely spaced, parallel P-N junctions is fabricated, wherein the illuminated surface is totally free of metallization, i.e., the junction nearest the illuminated surface is not electrically connected, and thereby participates only indirectly in the collection of photo-generated carriers by providing a charge field to suppress the front surface recombination and to enhance collection at the back side junction. All metallization is on the back side, which preferably includes an interposed finger pattern of N+ and P+ zones.

7 Claims, 2 Drawing Figures

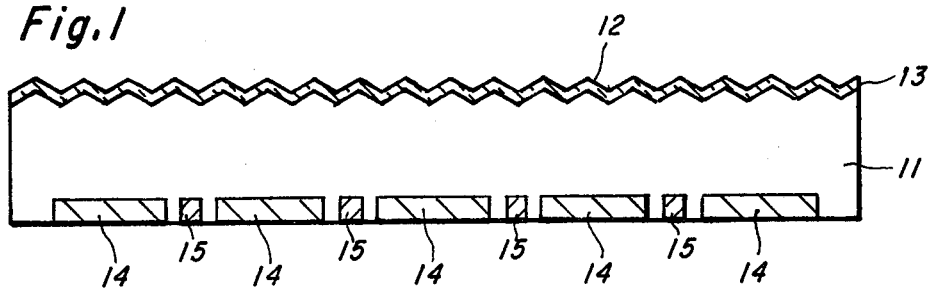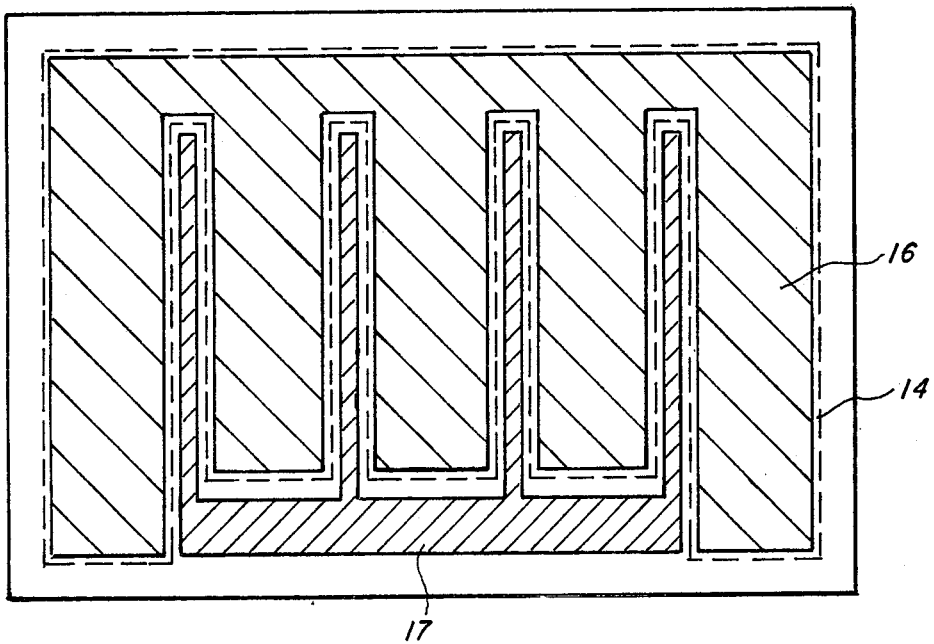

TANDEM JUNCTION SOLAR CELL

The U.S. Government has rights in this invention under Contract No. JPL 954405 of Jet Propulsion Laboratories.

This invention relates to photo-voltaic devices, and more particularly to a tandem junction solar cell having an extremely shallow "floating" PN junction at the illuminated surface, in combination with a closely spaced, parallel PN junction near the back side of the device, where all contact metallization is located.

The potential for economic photo-voltaic conversion of solar energy has provided ample incentive for the development of a more efficient semiconductor solar cell. One factor which limits the efficiency of such a cell is the high probability that carries generated within the cell by solar radiation will be lost through recombination, instead of being collected at a PN junction. Holes produced in the N-type region may be lost by recombination in the bulk or at the front surface of the cell. Similarly, electrons produced in the P-region may recombine internally or at the rear surface of the cell. In order to minimize recombination at the front surface; the PN junction is generally made quite shallow, on the order of one-tenth to one-half micrometer deep, so that a major portion of the radiation will be adsorbed near the PN junction.

Various approaches to the improvement of carrier collection efficiency have been proposed; including for example the Bennett cell of U.S. Pat. No. 3,682,708 which includes a plurality of PN junctions all joined together and convoluted to form a single continuous PN junction, in combination with external circuit means to electrically interconnect all regions of P-type conductivity, and separately to interconnect all regions of N-type conductivity. The convoluted junction thus provides a greater probability that carriers generated anywhere in the cell may encounter a portion of the convoluted PN junction before recombination occurs.

The desirability has also been recognized of keeping the top surface of a solar cell free of any shadowing effect, i.e., free of metallization, or other ohmic contacts, in order that the illuminated surface may have a total exposure to the impinging radiation. Thus, various schemes have been proposed to achieve complete back side bonding. For example, the above referenced Bennett patent proposes a "wrap-around" diffusion whereby the N-type region at the illuminated surface continues around the edge of the cell to the back side. Such an approach has not been satisfactory because the elongated current path through the diffused region increases the series resistance of the cell causing an unacceptable loss in power.

Accordingly, it is an object of the present invention to provide a solar cell having improved collection efficiency at reduced cost. The cell includes a P-N junction at the front surface and a separate, closely spaced, generally parallel P-N junction at the back surface. Only the back side junction is electrically connected for carrier collection, while the front junction is left unconnected, or "floating". Therefore, impinging radiation causes a charge field to be generated at the floating junction, which suppresses front surface recombination and enhances collection at the back side junction by accelerating electrons toward the back side junction. Thus, it is critical that the cell be quite thin, to maximize the field effect.

FIG. 1 is a greatly enlarged cross-sectional view of the cell of the invention, showing P-N junction geometry.

FIG. 2 is a greatly enlarged back side view of the cell of the invention, showing the metal contact pattern.

One aspect of the present invention is embodied in a solar cell comprising a semiconductor body predominately of one conductivity type having generally parallel opposite surfaces; a first PN junction in said body, formed by thin region of opposite conductivity type extending along a major part of one of said surfaces, said one surface being substantially free of metallization; a second PN junction in said body, generally parallel to said first junction, formed by a second region of opposite conductivity type adjacent the opposite surface of said body, said junctions being spaced apart by a distance of no more than 150 microns; and ohmic contacts to said second region and to a P-type portion of said body, respectively, on said opposite surface of the body.

For example, the semiconductor body may be a P-type silicon wafer preferably 50–100 micrometers thick, and having a resistivity of 0.1 to 10 ohm-centimeters. The first PN junction is formed by an N-type surface layer on the illuminated side of the wafer, said N-type region having a thickness of about 0.01 to 0.3 micrometers, and a resistivity of 100–5000 ohms per square. The illuminated surface is kept free of metallization, thereby providing a total exposure to impinging radiation. The second PN junction is formed by the diffusion of a second N-type region into the back surface of the wafer, said N-type region having a resistivity of 10–100 ohms per square, and preferably is provided with a fingered geometry for interdigitation with a P+ region to which ohmic contact is provided for the bulk of the semiconductor body.

All of the ohmic connections are on the non-illuminated side so that as much as 85% of the back side surface is N+, most of which is preferably covered by metallization, for example, Ti/Pd/Ag or Al/Ag. Approximately 10% of the back side surface is P+ with an equivalent amount of metal contact, also preferably Ti/Pd/Ag or Al/Ag. The remaining 5% of the back side surface is oxide passivation and separation between contact zones. Metal definition does not require fine geometry and the metal can be as thick as desired to achieve low resistance. The interdigitated metal pattern facilitates series interconnection of the devices into an array.

In FIG. 1, an embodiment of the cell of the invention is seen to consist of a predominantly P-type monocrystalline silicon body 11 having a resistivity of 5 ohm-cm and a nonreflective texture 12 on its illuminated surface. A first P-N junction is formed at the textured surface by a shallow N-type region 13 having a thickness of about 0.3 micrometer and a resistivity of about 100 ohms per square. Texturizing is achieved by any known means, such as a non-selective etching with NaOH.

At the back side, the cell includes a second PN junction formed by N-type region 14 having a depth of about 0.3 $\mu$m and a resistivity of 100 ohms per square. Since the total cell thickness is 50 $\mu$m, the two P-N junctions are spaced apart by slightly less than 50 $\mu$m, which is roughly equal to a diffusion length of electrons generated in the central P-type region. The two junctions are generally parallel to each other. The surface texture is somewhat exaggerated in the drawing, and does not materially alter the parallel relationship.

Although the example shown is fabricated from a P-type wafer, the invention also contemplates a reversal of all conductivity types, i.e., as would result from starting with an N-type wafer.

In FIG. 2, the back side of the cell of FIG. 1 is seen to have an interdigitated geometry. This is, N+ region 14 has a broad-fingered geometry to which metallization pattern 16 makes ohmic contact, while narrow-fingered P+ pattern 15, interdigitated therewith, has a corresponding metallization geometry 17. The broader fingers for region 14 improves collection efficiency by increasing the area of the back side P-N junction. Other geometries are also useful, optimization of which is not an essential part of the invention.

Test results and calculations have shown that the illustrated cell has the same collection efficiency as can be achieved by electrical connection of both junctions, while retaining the cost advantage of omitting top-side metal, together with avoidance of the shadowing effect that results from top-side metal. Additional savings are realized by using less semiconductor material, compared to the thicker conventional cells.

The cell is packaged in any known manner, which of course includes total exposure to impinging radiation.

Although the invention has been described as made from monocrystalline silicon, it will be apparent to those skilled in the art that polycrystalline silicon is also a useful semiconductor material for solar cell fabrication. Thin ribbon growth, for example, may become the most economic source of silicon for cell fabrication.

In addition, the cell of the invention may be made from GaAs or other IIIA-VA semiconductors, and from IIB-VIA compounds, such as CdS.

We claim:

1. A solar cell comprising:
   a. a semiconductor body predominantly of one conductivity type having substantially parallel opposite surfaces,
   b. a first PN junction in said body, formed by a first region of opposite conductivity type extending along a major part of one of said surfaces, said one surface being substantially free of metallization, or other shadowing effect, thereby being adapted to receive incident radiation,
   c. a second PN junction in said body, substantially parallel to said first junction, formed by second region of opposite conductivity type adjacent the opposite surface of said body, said junctions being electrically separate from each other, and spaced apart by a distance of no more than 150 micrometers, and
   d. ohmic contacts to said second region and to a central portion of said body, respectively, on said opposite surface whereby said first junction is electrically floating and provides a charge field to supress front surface recombination and enhances collection at said second junction.

2. A cell as in claim 1 wherein said body is a monocrystalline silicon wafer having a thickness of about 50 μm.

3. A cell as in claim 1 wherein said one conductivity type is P-type, and the central region of said cell has a resistivity of about 0.1 ohm-cm to 10 ohm-cm's.

4. A cell as in claim 1 wherein the depth of said first junction is about 0.01 to 0.3 μm.

5. A cell as in claim 1 wherein said second region of opposite conductivity type is of fingered geometry, interdigitated with fingered contact regions to the central region of said body.

6. A cell as in claim 1 wherein said body is a polycrystalline ribbon or sheet having a thickness of about 50 μm.

7. A cell as in claim 1 wherein said body is a semiconductor selected from IIIA-VA compounds and from IIB-VIA compounds.

* * * * *